United States Patent [19]
Kato

[11] Patent Number: 5,907,513
[45] Date of Patent: May 25, 1999

[54] SEMICONDUCTOR MEMORY DEVICE

[75] Inventor: Kunihiko Kato, Tokyo, Japan

[73] Assignee: NEC Corporation, Tokyo, Japan

[21] Appl. No.: 09/027,922

[22] Filed: Feb. 23, 1998

[30] Foreign Application Priority Data

Feb. 21, 1997 [JP] Japan ................................ 9-037407

[51] Int. Cl.⁶ .................................................. G11C 7/00
[52] U.S. Cl. .................... 365/200; 365/225.7; 365/96; 327/525; 326/38; 326/39; 326/41
[58] Field of Search ............................. 365/200, 225.7, 365/96; 327/525; 326/38, 39, 41

[56] References Cited

U.S. PATENT DOCUMENTS 5,768,198  6/1998  Moroo ................................ 365/200

FOREIGN PATENT DOCUMENTS

| 63-138599 | 6/1988 | Japan . |
| 4-65915 | 3/1992 | Japan . |
| 9204793 | 8/1997 | Japan . |

*Primary Examiner*—David Nelms
*Assistant Examiner*—Vanthu Nguyen
*Attorney, Agent, or Firm*—Sughrue, Mion, Zinn, Macpeak & Seas, PLLC

[57] ABSTRACT

A semiconductor memory device including redundancy decision circuitry having a block writing function is disclosed. The redundancy decision circuitry assigns a single fuse and a single transistor to each pair of upper and lower bits of a plurality of column addresses. Selectors each selects either one of particular upper and lower bits input thereto. The device therefore reduces the number of fuses corresponding to column mask signals to be used at the time of block writing, thereby reducing the area to be occupied by the redundancy decision circuitry.

3 Claims, 3 Drawing Sheets

SEMICONDUCTOR MEMORY DEVICE

BACKGROUND OF THE INVENTION

The present invention relates to a semiconductor memory device and, more particularly, to a semiconductor memory device including column redundancy decision circuitry having a block writing capability.

Conventional semiconductor memory devices include one having column redundancy decision circuitry capable of writing data in a plurality of column addresses at the same time (generally referred to as block writing). The problem with the conventional redundancy decision circuitry is that it needs the same number of fuses as the number of columns for block writing. It follows that when the number of replacements of a redundancy column or the number of columns for block writing is increased with an increase in the capacity of the memory device, the area which the redundancy decision circuitry occupies increases noticeably.

Technologies relating to the present invention are disclosed in, e.g., Japanese Patent Laid-Open Publication Nos. 63-138599, 4-65915, and 9-204793.

SUMMARY OF THE INVENTION

It is therefore an object of the present invention to provide a semiconductor memory device allowing the number of replacements of a redundant column or the number of columns for block writing to be increased while reducing the increase ratio of the area of redundancy decision circuitry.

A semiconductor memory device of the present invention includes redundancy decision circuitry having a first decision circuit and a second decision circuit. The first decision circuit has fuses and transistors corresponding to a plurality of column addresses of a memory cell array for generating a first decision signal based on the lower bits of the column addresses. The second decision circuit has fuses and transistors corresponding to the plurality of column addresses for generating a second decision signal indicative of whether or not data should be written to a column address to be replaced when data are simultaneously written to the column addresses. The second decision circuit assigns one of the fuses and one of the transistors thereof to each of pairs of upper bits and lower bits of the column addresses, and further has selectors each for selecting one of the upper bit and the lower bit input thereto.

BRIEF DESCRIPTION OF THE DRAWINGS

The above and other objects, features and advantages of the present invention will become apparent from the following detailed description taken with the accompanying drawings in which.

Figure 1:
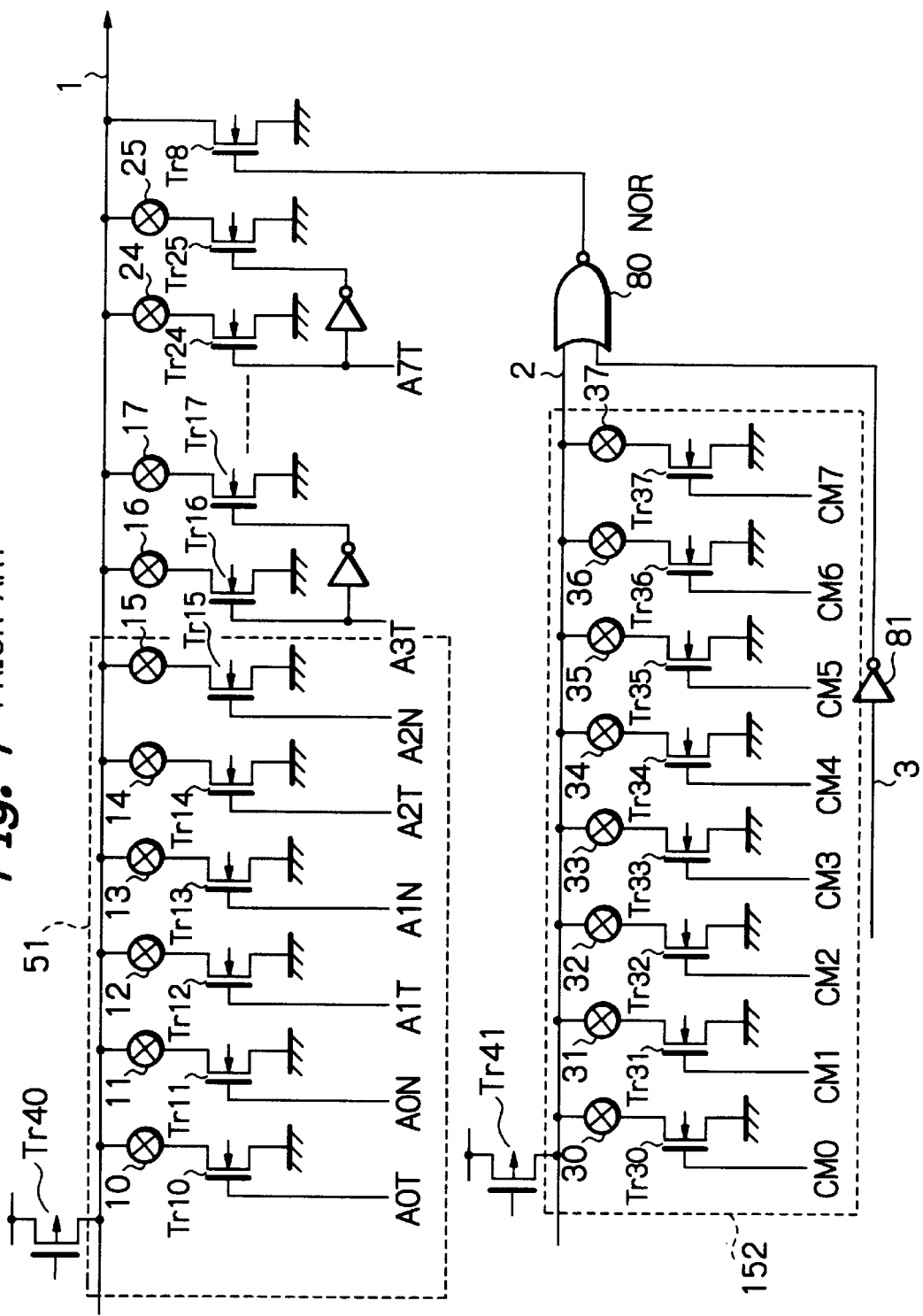
FIG. 1 is a circuit diagram showing a specific configuration of redundancy decision circuitry included in a conventional semiconductor memory device.

In the drawings, identical references denote identical structural elements.

DESCRIPTION OF THE PREFERRED EMBODIMENTS

To better understand the present invention, brief reference will be made to specific redundancy decision circuitry included in a conventional semiconductor memory device, shown in FIG. 1. The decision circuitry to be described is of the type having eight-column block writing function by way of example. As shown, the decision circuitry includes a lower bit decision circuit or first decision circuit 51 to which column address signals A0T–A2T representative of the lower bits of a plurality of column addresses included in a memory cell array, not shown, are input. In response to the column address signals A0T–A2T, the decision circuit 51 outputs a redundancy decision signal or first decision signal 1. A p-channel MOS (Metal Oxide Semiconductor) transistor Tr4O is connected to the decision circuit 51 so as to cause the redundancy decision signal 1 to be output. A column mask decision circuit or second decision circuit 152 receives column mask signals CM0–CM7 indicative of whether or not data should be written column addresses replaced in correspondence to a redundancy section not shown. In response to the column mask signals CM0–CM7, the decision circuit 152 outputs a column mask decision signal or second decision signal 2. A p-channel MOS transistor Tr41 is connected to the decision circuit 152 in order to cause the column mask decision signal 2 to be output. Column address signals A3T–A7T representative of the upper bits of the column addresses of the memory cell array are input to the gates of n-channel MOS transistors Tr16–Tr25. Fuses 16–25 are serially connected to the n-channel MOS transistors Tr16–Tr25, respectively. The column mask decision signal 2 output from the decision circuit 152 and a block write decision signal 3 input via an inverter 81 are applied to a NOR gate 80. The output of the NOR gate 80 is applied to the gate of an n-channel MOS transistor Tr8. The transistor Tr8 produces an OR of the output of the NOR gate 80 and the output of the decision circuit 51.

Specifically, in the lower bit decision circuit 51, fuses 10–15 are serially connected to n-channel MOS transistors Tr10–Tr15, respectively. The column address signals A0T–A2T and column address signals A0N–A2N are respectively input to the gates of the transistors Tr10–Tr15. The column mask decision circuit 152 has n-channel MOS transistors Tr3O–Tr37 respectively receiving the column mask signals CM0–CM7 via gates thereof, and fuses 30–37 serially connected to the transistors Tr3O–Tr37. The transistors Tr10–Tr15 each is connected to the output terminal of the decision circuit 51 via associated one of the fuses 10–15 at one end and connected to ground at the other end. Likewise, the transistors Tr3O–Tr37 each is connected to the output terminal of the decision circuit 152 via associated one of the fuses 30–37 at one end and connected to ground at the other end.

In operation, the redundancy decision signal 1 is in its high level in a redundant state. In this state, redundant columns are selected in place of usual columns. The block writing function is such that data are written to a plurality of addresses at the same time by invalidating the lower bits of column addresses, e.g., lower three bits in the case of eight-column block writing. Therefore, for redundancy decision, all the transistors corresponding to the lower bits are turned off in order to invalidate the lower bits. As a result, redundancy decision is made on the basis of the output of the decision circuit 51 relating only to the upper bits and the output of the decision circuit 152. More specifically, at the time of block writing, the column address signals A0T–A2T and A0N–A2N input to the decision circuit 51 and representative of the lower bits of the addresses are fixedly held in their low levels, so that all the transistors Tr10–Tr15 are turned off. For this purpose, the decision circuit 51 has an active high input and an active low input for the upper bit column address signals A3T–A7T.

The column masking function is a part of a block writing function customarily included in, e.g., a video RAM. While the block writing function causes identical data to be written to a plurality of columns at the same time, the column masking function allows, when writing the data in all the column addresses is not desired, the data to be written only to every other column. The column mask signals CM0–CM7 each allows data to be written to a designated address when it is in a low level, but does not allow data to be written thereto when it is in a high level.

During usual writing, as distinguished from block writing, the block write decision signal 3 is held in its low level so as to continuously turn off the transistor Tr8. In this condition, the column mask decision signal 152 is invalidated. Specifically, only when all the transistors whose fuses are not shut off, the redundancy decision signal 1 precharged beforehand is held in its high level representative of a redundant state.

On the other hand, at the time of block writing, i.e., when the block write decision signal 3 is in its high level, the lower bit column address signals A0T–A2T and A0N–A2N are fixedly held in their low levels. In this condition, only one of the fuses 30–37 of the decision circuit 152 corresponding to a redundant address is not shut off. For example, assume that only the fuse 30 corresponding to the column mask signal CM0 is not shut off, but all the other fuses 31–37 corresponding to the column mask signals CM1–CM7, respectively, are shut off. Then, only if the redundancy decision signal responsive to the upper bit column address signals A3T–A7T is in its high level (all the transistors whose fuses are not shut off are turned off), and if the column mask signal CM0 is in its low level (writable), the column mask decision signal 2 is held in its high level. Consequently, the output of the NOR gate 80 remains in its low level and turns off the transistor Tr8, so that the redundancy decision signal 1 remains in its high level representative of a redundant state.

A semiconductor memory device using the above redundancy decision circuitry has the problem discussed earlier.

Figure 2:
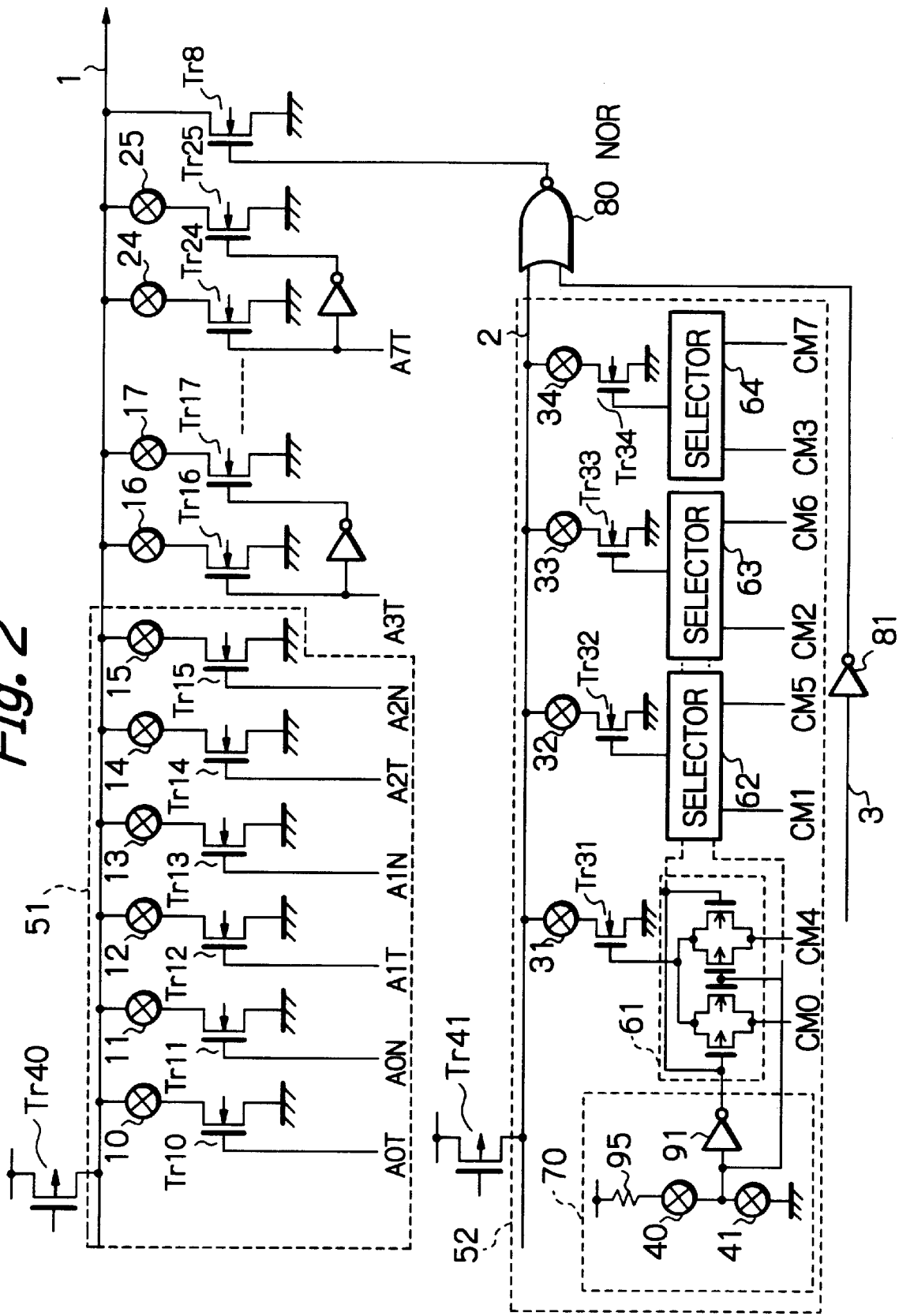
FIG. 2 is a schematic block diagram showing redundancy decision circuitry included in a semiconductor memory device embodying the present invention.

Referring to FIG. 2, redundancy decision circuitry included in a semiconductor memory device embodying the present invention is shown and also assumed to have an eight-column block writing function. As shown, the illustrative embodiment is similar to the conventional circuitry except that it has a column mask decision circuit 52 in place of the column mask decision circuit 152.

As shown in FIG. 2, the column mask decision circuit 52 includes four selectors 61, 62, 63 and 64. The selector 61 selects either one of column mask signals CM0 and CM4 input thereto while the selector 62 selects either one of column mask signals CM1 and CM5 input thereto. Likewise, the selectors 63 and 64 respectively select one of column mask signals CM2 and CM6 and one of column mask signals CM3 and CM7 input thereto. A selector control circuit 70 controls the operation of the selectors 61–64. The outputs of the selectors 61–64 are applied to the gates of n-channel MOS transistors Tr31–Tr34, respectively. Fuses 31–34 are serially connected to the transistors Tr31–Tr34, respectively. The column mask signals CM0–CM3 and column mask signals CM4–CM7 are assigned to the lower bits and higher bits, respectively.

The selector control circuit 70 is made up of a resistor 9 5 and fuses 40 and 41 serially connected between a power source and ground, and an inverter 91 for inverting a signal representative of a potential between the fuses 40 and 41. The transistors Tr31–Tr34 each is connected to the output terminal of the decision circuit 52 via associated one of the fuses 31–34 at one end and connected to ground at the other end. The selector control circuit 70 outputs the signal representative of a potential between the fuses 40 and 41 and the same signal inverted by the inverter 91.

The operation of the illustrative embodiment is as follows. Assume that the address of the column mask signal CM0 is a redundant address by way of example. Then, a transfer gate constituted by the p-channel and n-channel transistors connected to the lower bit column mask signals CM0–CM3 are validated. In this condition, the column mask signals CM0–CM3 are input to the gates of the n-channel transistors Tr31–Tr34, respectively. Among the fuses 31–34 used for redundancy decision at the time of block writing, the fuses 32–34 are shut off, but the fuse 31 corresponding to the redundant address is not shut off. As a result, the column mask decision circuit 52 determines that the address of the column mask signal CM0 is a redundant address.

Conversely, when a redundant address is present on any one of the upper bits, the fuse of the selector control circuit 70 is shut off. Consequently, a transfer gate constituted by the p-channel and n-channel transistors connected to the upper bit column mask signals CM4–CM7 is validated. The column mask signals CM4–CM7 are therefore applied to the gates of the n-channel Tr31–Tr34.

As stated above, either the lower bit column mask signals CM0–CM3 or the upper bit column signals CM4–CM7 are selected and respectively input to associated ones of the n-channel transistors Tr31–Tr34. The circuitry therefore halves the required number of fuses corresponding to the column mask signals to be used at the time of block writing, compared to the conventional circuitry shown in FIG. 1, although needing the extra fuses 40 and 41 of the selector control circuit 70.

Specifically, the illustrative embodiment reduces the number of fuses by only two in the case of eight-column block writing, compared to the conventional circuitry shown in FIG. 1. However, when the number of columns for block writing is increased to, e.g., sixteen, the illustrative embodiment is practicable with only ten fuses while the conventional circuitry needs sixteen fuses. This successfully reduces the circuitry scale.

Figure 3:
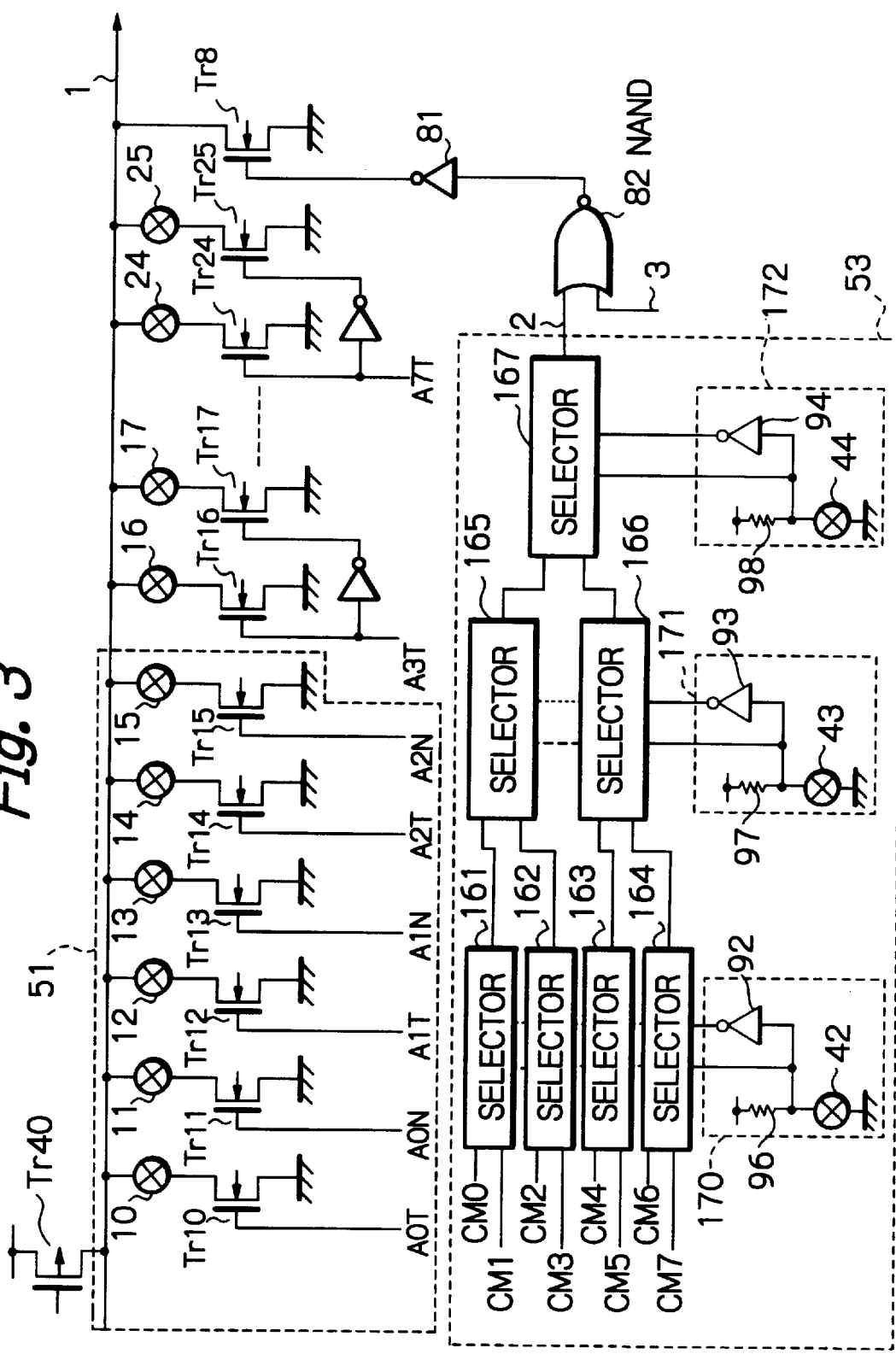
FIG. 3 is a schematic block diagram showing redundancy decision circuitry representative of an alternative embodiment of the present invention.

FIG. 3 shows redundancy decision circuitry representative of an alternative embodiment of the present invention and also assume to have an eight-column block writing function. As shown, selectors 161–167 are so arranged as to constitute a decoder. A selector control circuit 170 is connected to the selectors 161–164 while a selector control circuit 171 is connected to the selectors 165 and 166. Further, a selector control circuit 172 is connected to the selector 167. The selectors select the column mask signals CM0–CM7 under the control of the associated selector control circuits 170–172. The selector control circuit 170 has a resistor 96 and a fuse 42 serially connected between a power source and ground, and an inverter 92 for inverting a signal representative of a potential between the resistor 96 and the fuse 42. Likewise, the selector control circuits 171 and 172 respectively have resistors 97 and 98, fuses 43 and 44, and inverters 93 and 94 arranged in the same manner as the resistor 96, fuse 42 and inverter 92. The selector control circuits 170–172 respectively output the signals representative of potentials between the associated resistors 96–98 and the fuses 42 and 44 and the same signals inverted by the inverters 92–94.

Assume that the resistors 96–98 each has a resistance high enough to make a current expected to constantly flow therethrough when associated one of the fuses 42–44 is not shut off (not needing redundancy) negligible. Then, the selector control circuits 170–172 need only one fuse each, as illustrated. Therefore, as for eight-column block writing, the alternative embodiment is practicable with only three fuses at the time of block writing while the conventional circuitry shown in FIG. 1 needs sixteen fuses. Moreover, in the case of sixteen column block writing, the alternative embodiment needs only four fuses while the conventional circuitry needs sixteen fuses. In this manner, assuming M columns for block writing, the circuitry shown in FIG. 3 reduces the number n of fuses to n=log2M. This is a remarkable decrease in the number of fuses and therefore in the area of the circuitry.

In summary, it will be seen that the present invention provides a semiconductor memory device having various unprecedented advantages, as enumerated below.

(1) The device assigns a single fuse and a single transistor to each pair of upper and lower bits of a plurality of column addresses. Selectors each selects ether one of particular upper and lower bits input thereto. The device therefore reduces the number of fuses corresponding to column mask signals to be used at the time of block writing, thereby reducing the area of redundancy decision circuitry.

(2) The selectors connected in a decoder configuration further reduce the number of fuses corresponding to the column mask signals.

(3) Consequently, the device allows the number of replacements of a redundant column or the number of columns for block writing to be increased while reducing the increase ratio of the area to be occupied by the redundancy decision circuitry.

Various modifications will become possible for those skilled in the art after receiving the teachings of the present disclosure without departing from the scope thereof.

What is claimed is:

1. A semiconductor memory device comprising:

redundancy decision circuitry comprising a first decision circuit and a second decision circuit;

said first decision circuit comprising fuses and transistors corresponding to a plurality of column addresses of a memory cell array, for generating a first decision signal based on lower bits of the plurality of column addresses;

said second decision circuit comprising fuses and transistors corresponding to the plurality of column addresses, for generating a second decision signal indicative of whether or not data should be written to a column address to be replaced when data are simultaneously written to the plurality of column addresses;

said second decision circuit assigning one of said fuses and one of said transistors thereof to each of pairs of upper bits and lower bits of the plurality of column addresses, and further comprising selectors each for selecting one of the upper bit and the lower bit input thereto.

2. A device as claimed in claim 1, further comprising a control circuit for controlling said selectors.

3. A device as claimed in claim 1, wherein said selectors constitute a decoder.

* * * * *